United States Patent
Lee et al.

(10) Patent No.: US 7,625,777 B2
(45) Date of Patent: Dec. 1, 2009

(54) MEMORY DEVICE HAVING HIGHLY INTEGRATED CELL STRUCTURE AND METHOD OF ITS FABRICATION

(75) Inventors: Se-Ho Lee, Seoul (KR); Jae-Hee Oh, Gyeonggi-do (KR); Jae-Hyun Park, Gyeonggi-do (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 102 days.

(21) Appl. No.: 11/428,500

(22) Filed: Jul. 3, 2006

(65) Prior Publication Data

US 2007/0080421 A1    Apr. 12, 2007

(30) Foreign Application Priority Data

Jul. 1, 2005    (KR)    .................. 10-2005-0059414

(51) Int. Cl.
    H01L 21/336    (2006.01)
(52) U.S. Cl. .................. 438/102; 438/308; 438/131; 438/257; 438/95
(58) Field of Classification Search .................. 438/257, 438/308, 466; 365/63, 103
    See application file for complete search history.

(56) References Cited

U.S. PATENT DOCUMENTS

| | | | | |
|---|---|---|---|---|
| 5,359,205 | A * | 10/1994 | Ovshinsky | 257/3 |
| 6,579,760 | B1 * | 6/2003 | Lung | 438/257 |
| 6,740,921 | B2 * | 5/2004 | Matsuoka et al. | 257/302 |
| 6,750,101 | B2 * | 6/2004 | Lung | 438/257 |
| 6,816,404 | B2 * | 11/2004 | Khouri et al. | 365/163 |
| 6,873,541 | B2 * | 3/2005 | Lung et al. | 365/153 |
| 6,984,548 | B2 * | 1/2006 | Lung et al. | 438/131 |
| 6,992,365 | B2 * | 1/2006 | Xu et al. | 257/529 |
| 7,071,485 | B2 * | 7/2006 | Takaura et al. | 257/3 |
| 7,164,147 | B2 * | 1/2007 | Lee et al. | 257/4 |
| 7,332,377 | B2 * | 2/2008 | Happ et al. | 438/129 |
| 2002/0081833 | A1 * | 6/2002 | Li et al. | 438/622 |
| 2003/0073262 | A1 | 4/2003 | Xu et al. | |
| 2003/0146469 | A1 * | 8/2003 | Matsuoka et al. | 257/328 |

(Continued)

FOREIGN PATENT DOCUMENTS

KR    2003-0095347    12/2003

(Continued)

OTHER PUBLICATIONS

English language abstract of Korean Publication No. 10-2004-0054250.

(Continued)

Primary Examiner—Steven Loke
Assistant Examiner—David Goodwin
(74) Attorney, Agent, or Firm—Marger Johnson & McCollom, P.C.

(57) ABSTRACT

In an embodiment, a memory device, with a highly integrated cell stricture, includes a mold insulating layer disposed on a semiconductor substrate. At least one conductive line is disposed on the mold insulating layer. Data storage elements self-aligned with the conductive line are interposed between the conductive line and the mold insulating layer. In this case, each of the data storage elements may include a resistor pattern and a barrier pattern, which are sequentially stacked, and the resistor pattern may be self-aligned with the barrier pattern.

12 Claims, 15 Drawing Sheets

U.S. PATENT DOCUMENTS

Figure 1:
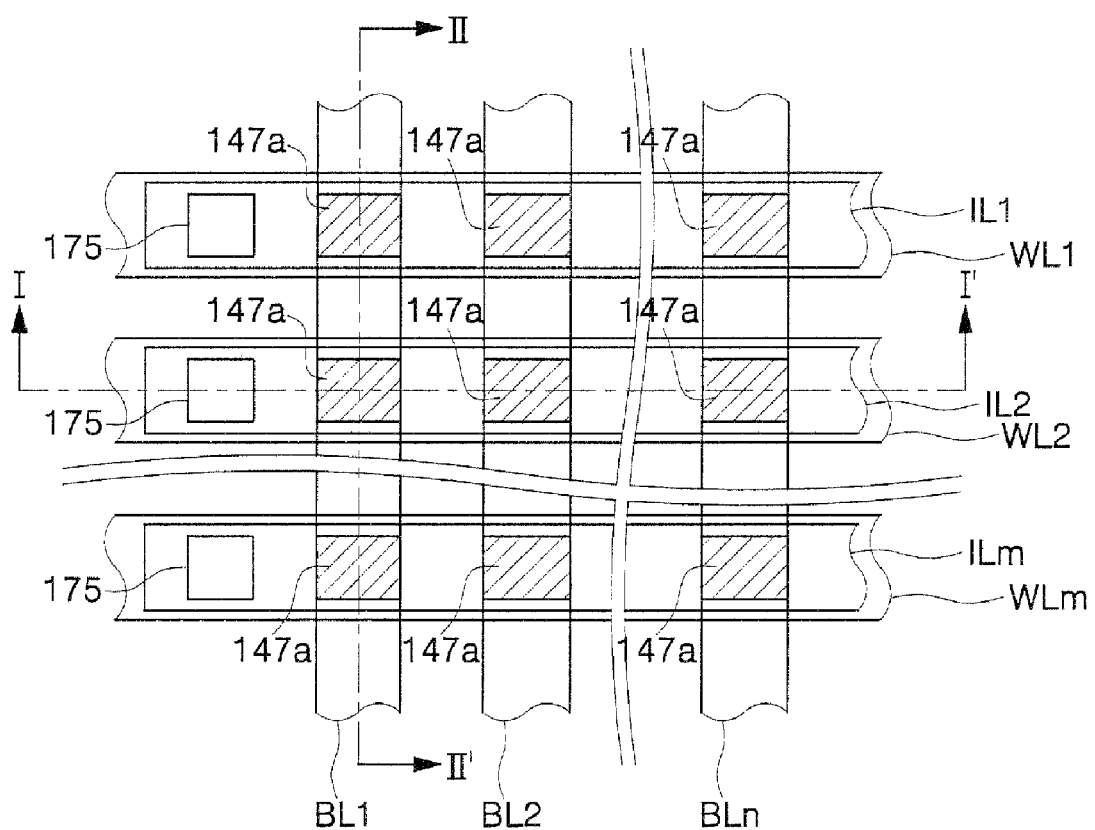

2003/0186481 A1    10/2003    Lung
2004/0188735 A1     9/2004    Hideki

FOREIGN PATENT DOCUMENTS

| KR | 10-2004-0054250 | 6/2004 |
|---|---|---|
| KR | 2004-0047272 | 6/2004 |
| KR | 2001-0055879 | 7/2004 |
| KR | 10-2005-0011059 | 1/2005 |

OTHER PUBLICATIONS

English language abstract of Korean Publication No. 10-2005-0011059.

* cited by examiner

MEMORY DEVICE HAVING HIGHLY INTEGRATED CELL STRUCTURE AND METHOD OF ITS FABRICATION

This application claims the benefit of Korean Patent Application No. 10-2005-0059414, filed on Jul. 1, 2005, the contents of which are hereby incorporated herein by reference in their entirety.

BACKGROUND

1. Field of the Invention

The present invention relates to a semiconductor device and a method of its fabrication, and more particularly, to a memory device having a highly integrated cell structure and a method of its fabrication.

2. Description of Related Art

Nonvolatile memory devices do not lose their stored data even if their power is interrupted. In general, nonvolatile memory devices employ flash memory cells having a stacked gate structure. The stacked gate structure includes a tunnel oxide layer, a floating gate, an inter-gate dielectric layer, and a control gate electrode, which are sequentially stacked on a channel. Accordingly, the tunnel oxide layer should have improved film quality and the coupling ratio of the flash memory cells should be increased to enhance the reliability and programming efficiency of the flash memory cells.

Novel nonvolatile memory devices, for example, phase-change memory devices, have been proposed as a substitute to conventional flash memory devices. In the phase-change memory devices, a unit cell includes a cell switching device and a phase-change material layer connected to the cell switching device. In this case, an upper electrode and a lower electrode are provided on and under the phase-change material layer, respectively. The lower electrode may be electrically connected to the cell switching device, and the upper electrode may be electrically connected to a bit line provided on the phase-change material layer. The cell switching device may be an active device, such as a MOS transistor.

Particularly in recent years, semiconductor devices are highly integrated. Accordingly, to enhance the integration density of a memory device, it is necessary to reduce the area occupied by a unit cell of the memory device.

A large program current, which is supplied through the MOS transistor, of at least several mA is required to program the phase-change memory cell. To reduce the area occupied by the unit cell of the memory device, the area of the MOS transistor used as the switching device needs to be reduced. However, it is technically difficult to reduce its area.

Also, the phase-change material layer should be formed to a small size to scale down the unit cell of the memory device. In particular, when the phase-change material layer is formed in an island form using typical photolithography and etching processes, there is a technical limit in reducing its size.

Furthermore, as the integration density of the memory devices increases, since the area of the unit cells of the memory device correspondingly decreases, it may be difficult to form the upper electrode contacting a top surface of the phase-change material layer. In particular, as the size of the phase-change material layer decreases, the margin of the process of forming the upper electrode interposed between the phase-change material layer and the bit line provided on the phase-change material layer also decreases, and thus the process of forming the upper electrode becomes difficult. Specifically, the upper electrode, which is interposed between the phase-change material layer and the bit line and in contact with the top surface of the phase-change material layer, may include a top electrode contact (TEC) and a contact plug. In forming the TEC, which contacts the top surface of the phase-change material layer, and the contact plug, which connects the TEC and the bit line, the phase-change material layer may be misaligned with the contact plug as a consequence of the downscaling of the phase-change material layer. Thus, the phase-change material layer may be misaligned with the bit line.

Therefore, it is necessary to develop a novel structure and method for reducing the area occupied by the unit cells of the memory device to increase the integration density of the memory device.

SUMMARY

Embodiments of the invention provide a memory device having a highly integrated cell structure.

Other embodiments of the inventions provide methods of fabricating a memory device having a highly integrated cell structure.

In one embodiment, the memory device includes a mold insulating layer disposed on a semiconductor substrate. At least one conductive line is disposed on the mold insulating layer. Data storage elements are interposed between the conductive line and the mold insulating layer to be self-aligned with the conductive line.

In some embodiments of the present invention, each of the data storage elements may include a resistor pattern and a barrier pattern, which are sequentially stacked, and the resistor pattern may be self-aligned with the barrier pattern. The resistor pattern may be a phase-change material layer pattern. The barrier pattern may include a metal nitride layer.

In other embodiments, the conductive line may include a metal nitride layer and a metal layer, which are sequentially stacked.

In still other embodiments, the memory device may further include insulating material layer patterns covering sidewalls of the data storage elements, which are substantially parallel to a widthwise direction of the conductive line. The insulating material layer patterns may be arranged in lines such that the insulating material layer patterns fill regions between the data storage elements and cross the conductive line. The memory device may further include protective insulating layer patterns interposed between the insulating material layer patterns and the data storage elements and between the insulating material layer patterns and the mold insulating layer.

In yet other embodiments, the memory device may further include a semiconductor pattern and a lower electrode interposed between the semiconductor substrate and the data storage element. The semiconductor pattern and the lower electrode may be sequentially stacked on the semiconductor substrate through the mold insulating layer. The semiconductor pattern may constitute a vertical-contact-type cell diode. The memory device may further include an insulating contact spacer interposed between the mold insulating layer and the lower electrode.

Another aspect of the present invention is directed to a method of fabricating a memory device having a highly integrated cell structure. The method includes forming a mold insulating layer on a semiconductor substrate. A plurality of parallel data storage element lines is formed on the mold insulating layer. At least one conductive line is formed across the data storage element lines. The data storage element lines are etched using the conductive line as an etch mask, thereby forming data storage elements self-aligned with the conductive line at intersections between the conductive line and the data storage elements lines.

In some embodiments of the present invention, each of the data storage element lines may be formed by sequentially stacking a resistor line and a barrier layer. The resistor line may include a phase-change material layer. The barrier layer may include a metal nitride layer.

In other embodiments, the conductive line may be formed by sequentially stacking a metal nitride layer and a metal layer.

In still other embodiments, after the data storage element lines are formed, insulating protective spacers may be further formed to cover sidewalls of the data storage element lines.

In yet other embodiments, after the data storage element lines are formed, interlayer dielectric layer patterns may be further formed between the data storage element lines. The formation of the interlayer dielectric layer patterns may include forming an interlayer dielectric layer on the semiconductor substrate having the data storage element lines, and planarizing the interlayer dielectric layer. Before the interlayer dielectric layer is formed, a protective insulating layer may be further formed on the semiconductor substrate having the data storage element lines.

Still another aspect of the present invention is directed to a method of fabricating a memory device having a highly integrated cell structure. The method includes forming a mold insulating layer on a semiconductor substrate. Cell diode holes are formed through the mold insulating layer. A semiconductor pattern and a lower electrode are sequentially stacked in each of the cell diode holes. The cell diode holes are covered by a plurality of parallel data storage element lines. At least one conductive line is formed across the data storage element lines to be substantially aligned with upper portions of the cell diode holes in a vertical direction. The data storage element lines are etched using the conductive line as an etch mask, thereby forming data storage elements self-aligned with the conductive line at intersections between the conductive line and the data storage element lines.

In some embodiments of the present invention, the semiconductor pattern may constitute a vertical-contact-type cell diode.

In other embodiments, before the lower electrode is formed, insulating contact spacers may be further formed on sidewalls of the cell diode holes, which are exposed due to a step difference between a top surface of the mold insulating layer and a surface of the semiconductor pattern.

In still other embodiments, each of the data storage element lines may be formed by sequentially stacking a resistor line and a barrier layer. The resistor line may include a phase-change material layer. The barrier layer may include a metal nitride layer.

In yet other embodiments, the conductive line may be formed by sequentially stacking a metal nitride layer and a metal layer.

In still other embodiments, after the data storage element lines are formed, insulating protective spacers may be further formed to cover sidewalls of the data storage element lines.

In yet other embodiments, after the data storage element lines are formed, interlayer dielectric layer patterns may be further formed between the data storage element lines. The formation of the interlayer dielectric layer patterns may include forming an interlayer dielectric layer on the semiconductor substrate having the data storage elements, and planarizing the interlayer dielectric layer.

BRIEF DESCRIPTION

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

FIG. 1 is a plan view of a memory device according to exemplary embodiments of the present invention.

FIGS. 2A, 3A, 4A, 5A, 6A, 7A, and 8A are cross-sectional views taken along line I-I' of FIG. 1, illustrating a memory device according to exemplary embodiments of the present invention.

FIGS. 2B, 3B, 4B, 5B, 6B, 7B, and 8B are cross-sectional views taken along line II-II' of FIG. 1, which illustrate a memory device according to exemplary embodiments of the present invention.

Figure 6A:
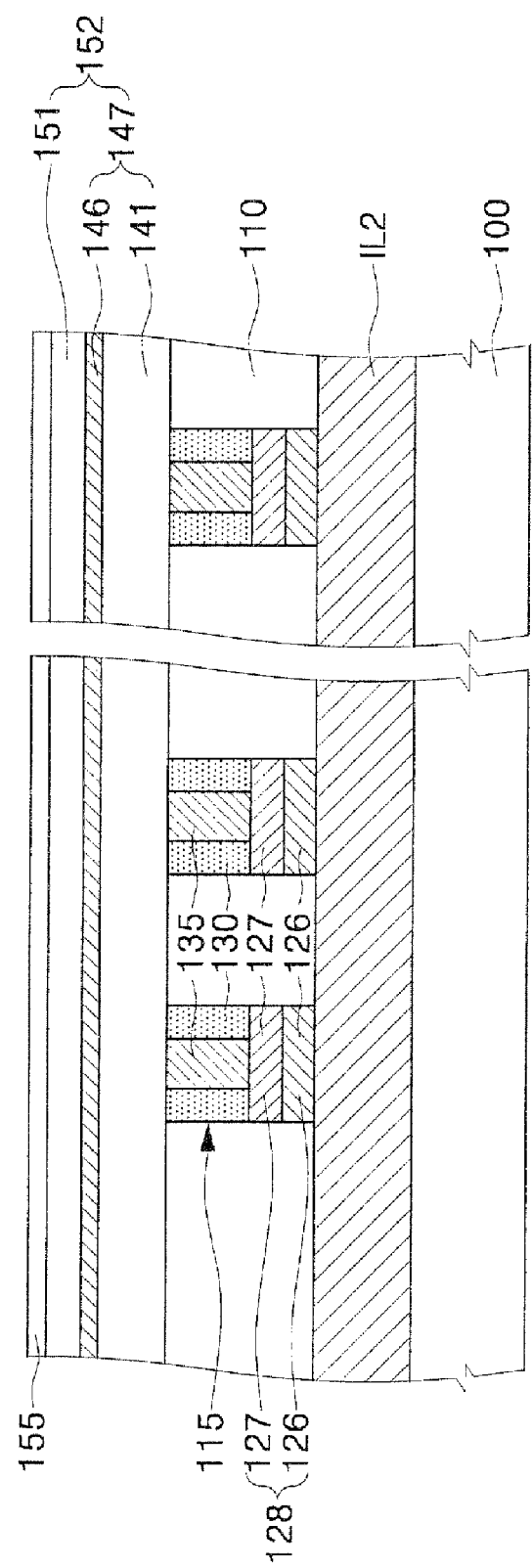
Figure 6B:
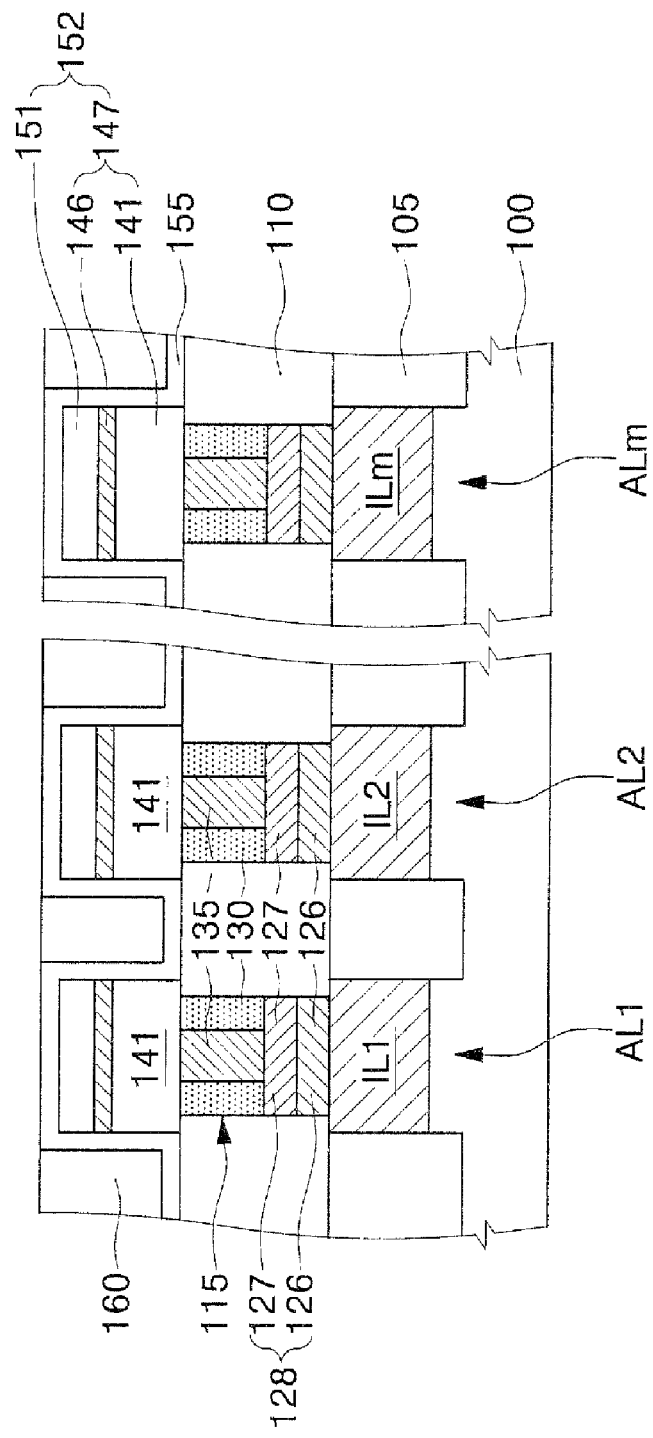
Figure 6C:
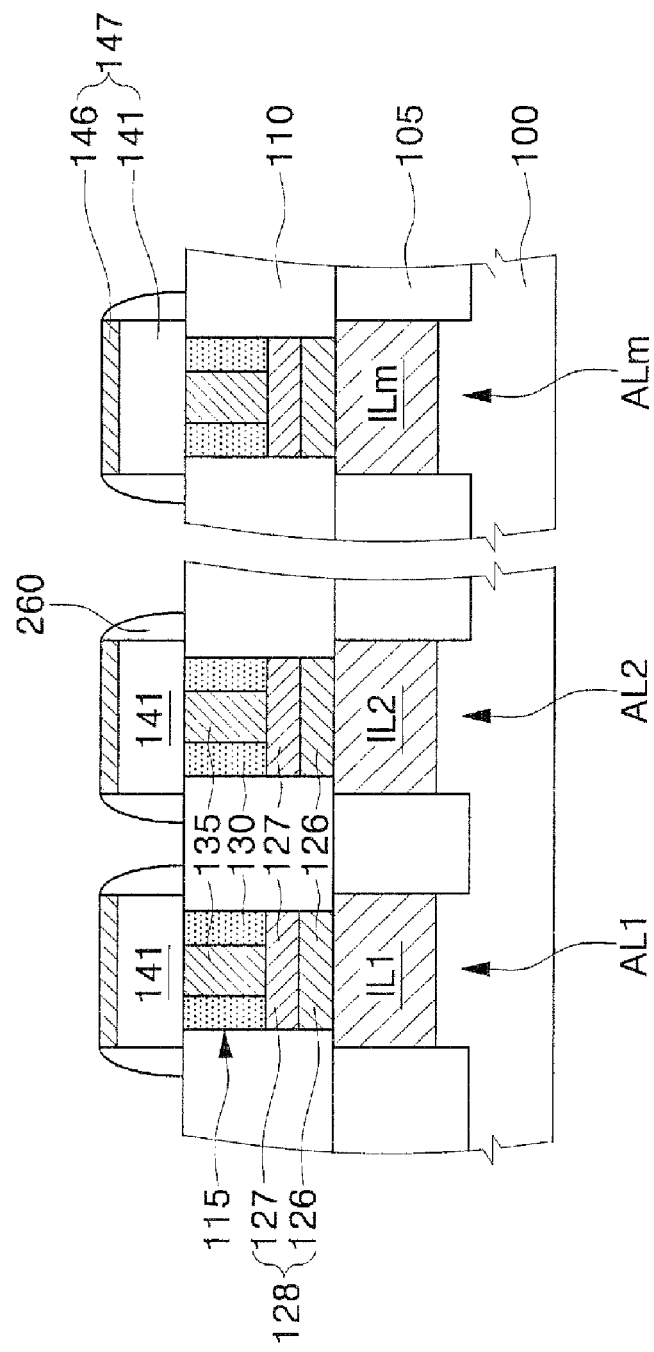
Figure 7A:
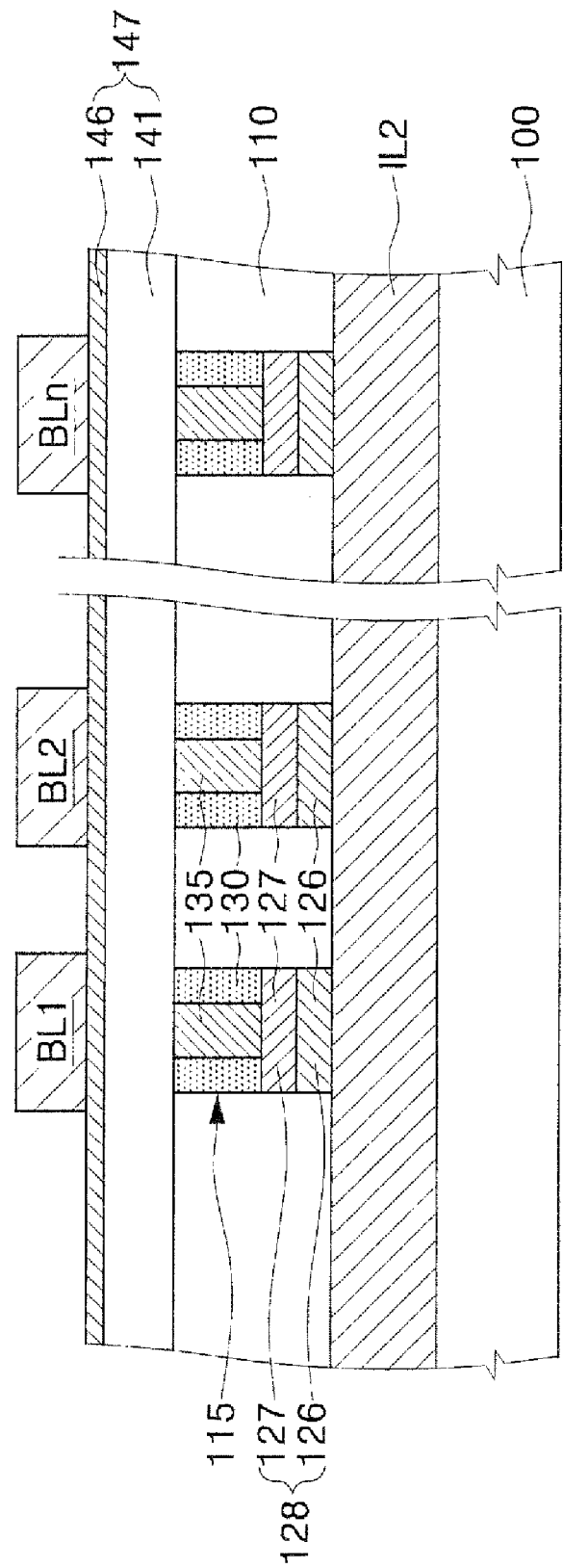
Figure 7B:
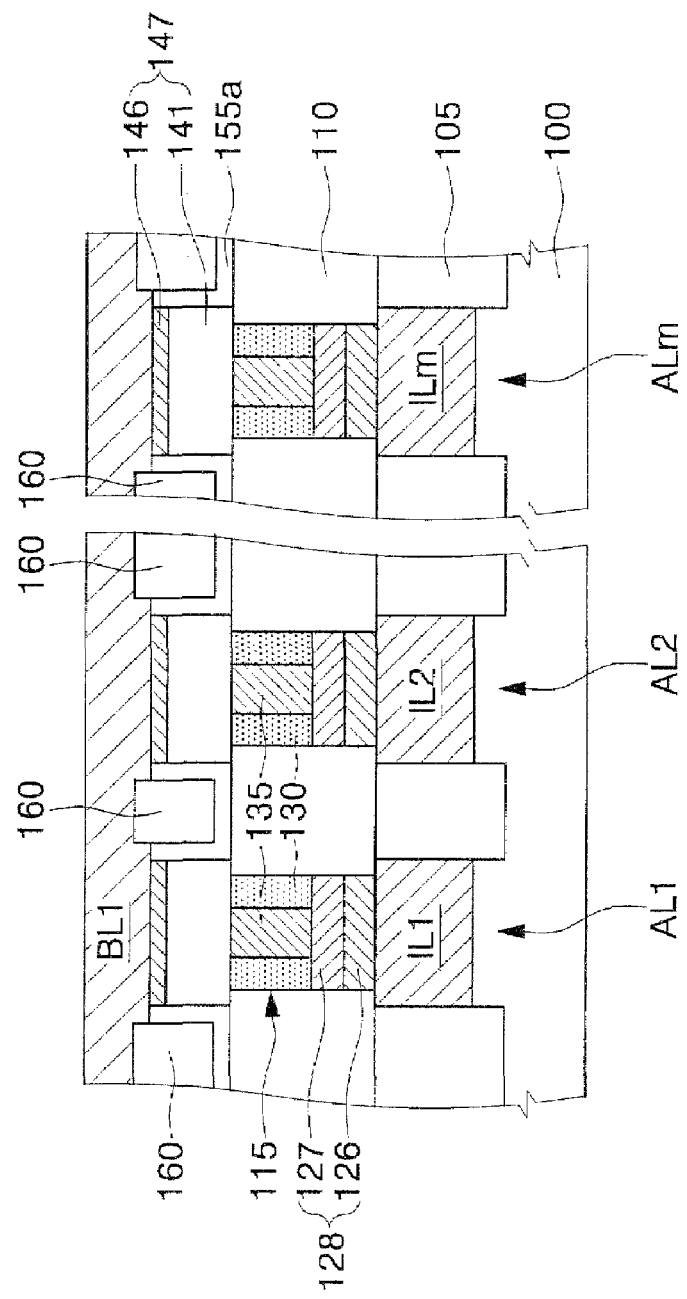
Figure 7C:
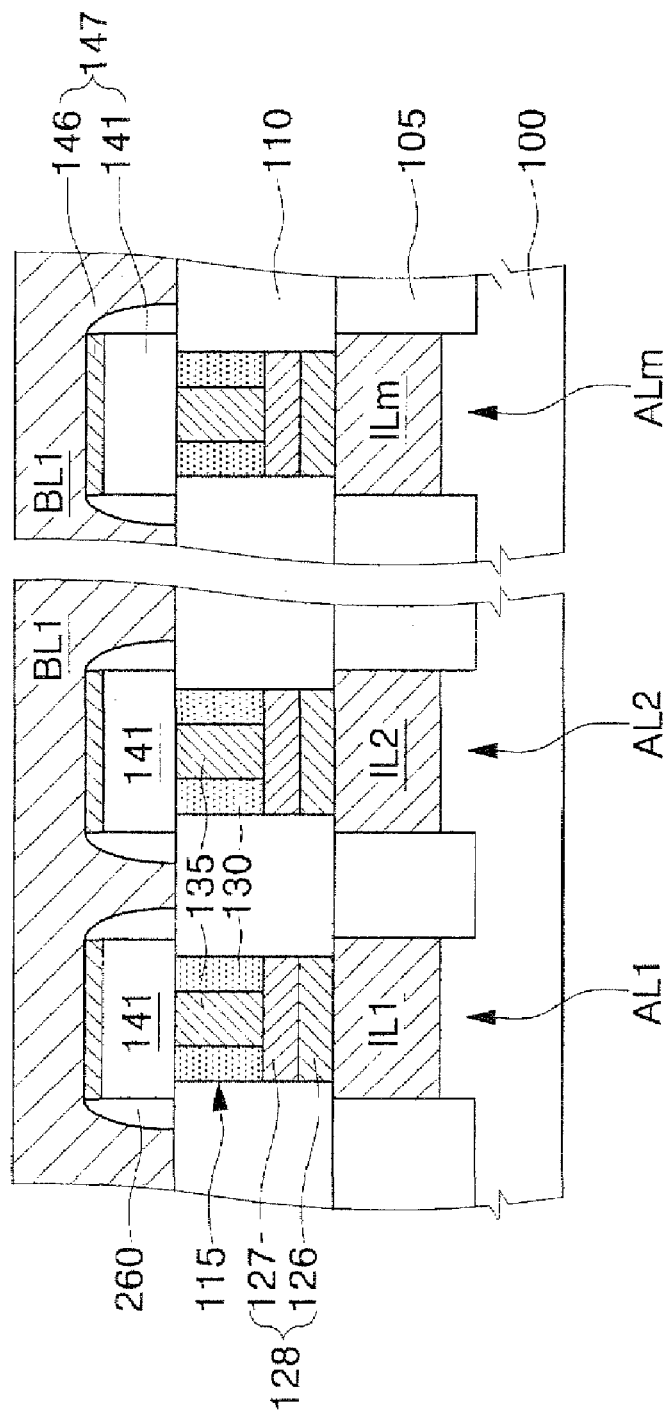
Figure 8A:
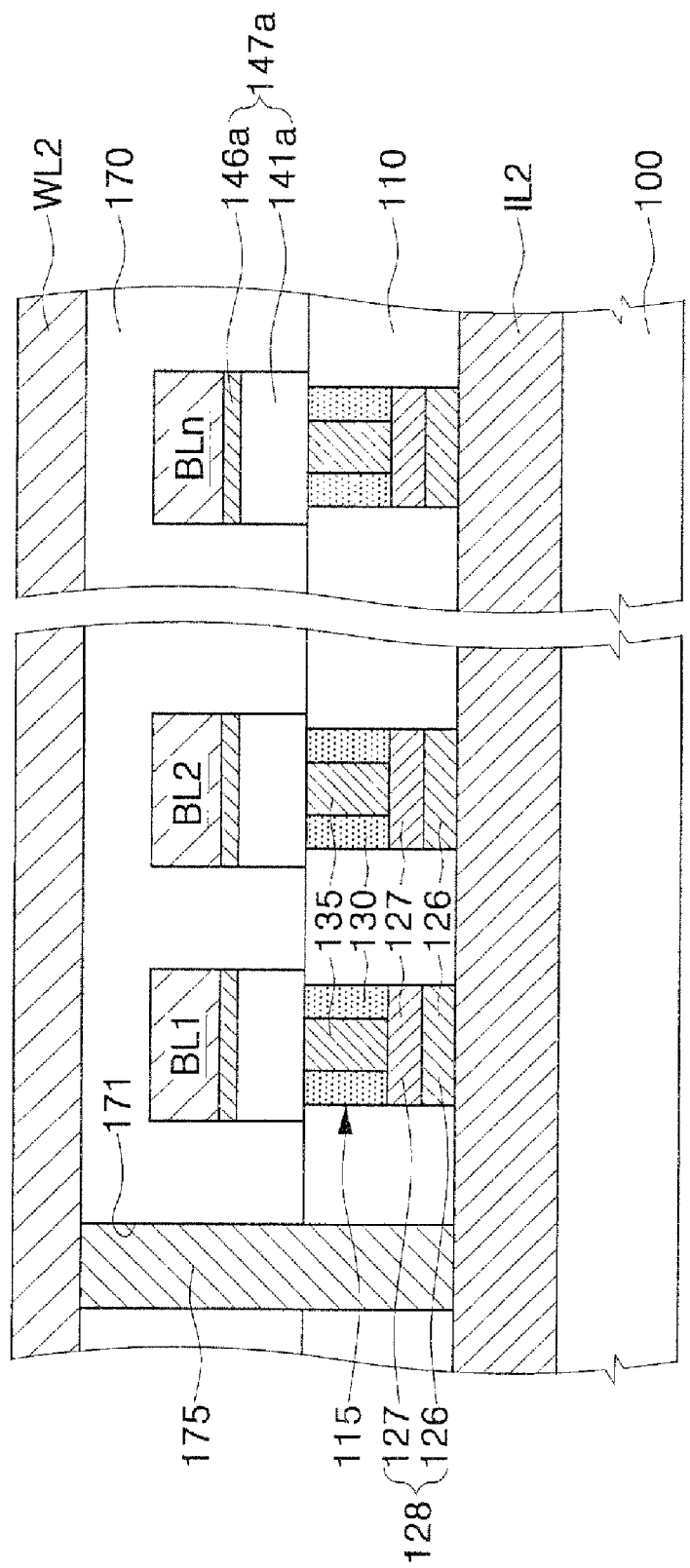
Figure 8B:
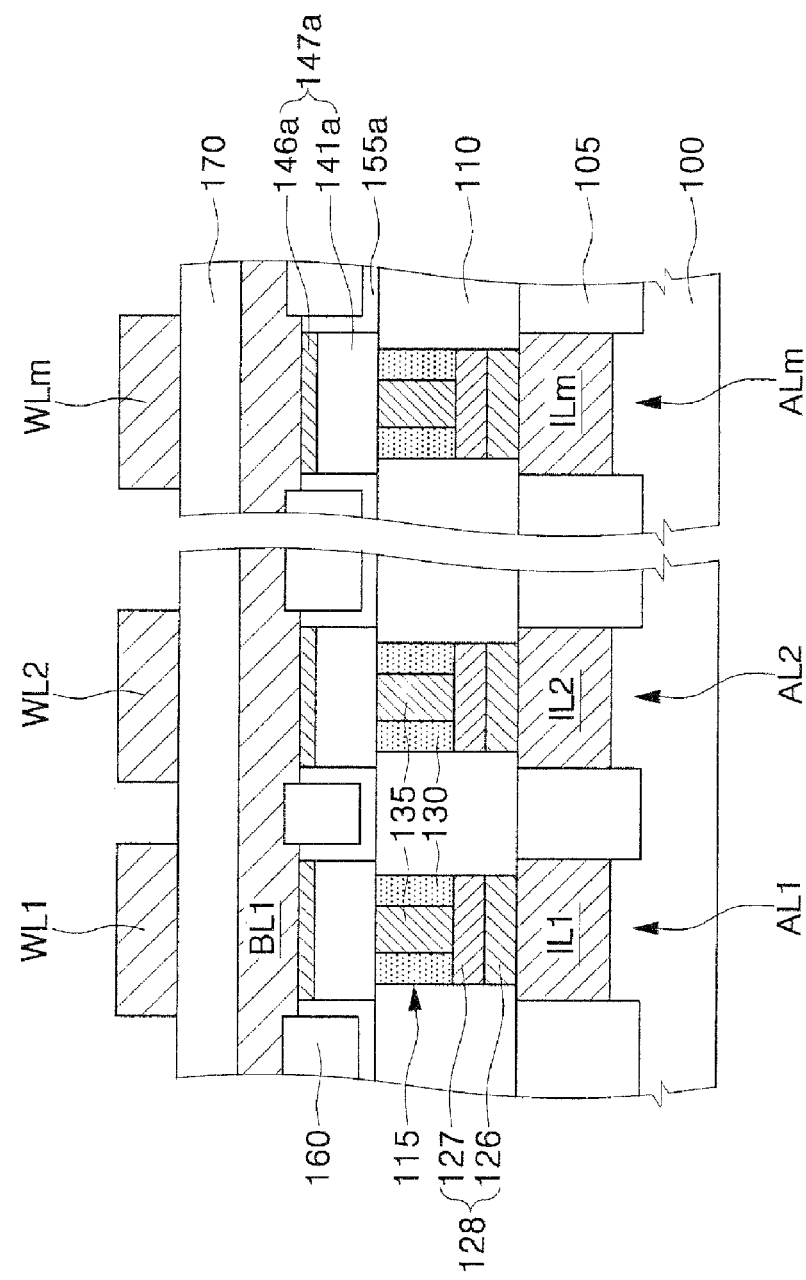
Figure 8C:
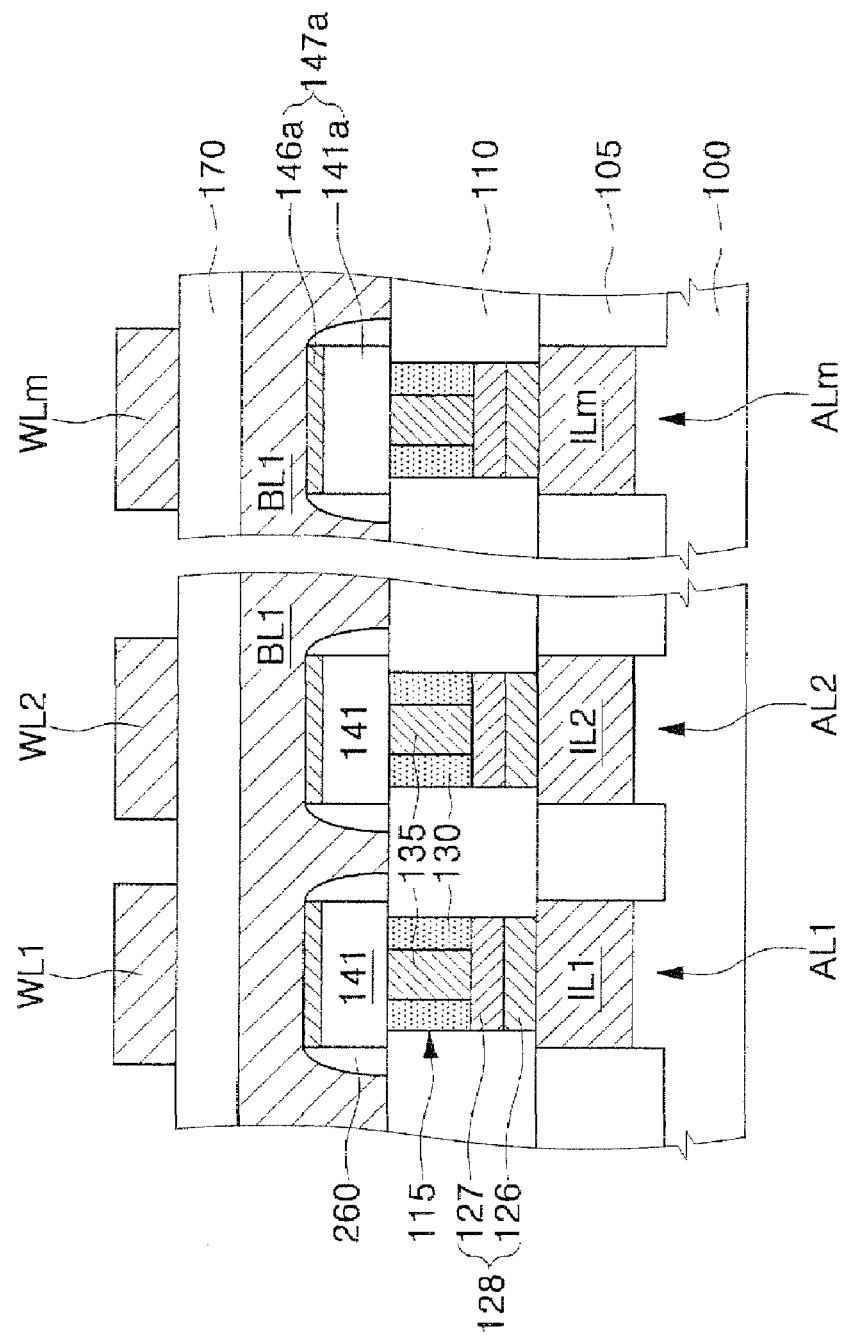

FIGS. 6C, 7C, and 8C are cross-sectional views taken along line II-II' of FIG. 1, illustrating a memory device according to other exemplary embodiments of the present invention.

DETAILED DESCRIPTION

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity. The same reference numerals are used to denote the same elements.

FIG. 1 is a plan view of a memory device according to exemplary embodiments of the present invention. FIGS. 2A, 3A, 4A, 5A, 6A, 7A, and 8A are cross-sectional views taken along line I-I' of FIG. 1, illustrating a memory device according to exemplary embodiments of the present invention. FIGS. 2B, 3B, 4B, 5B, 6B, 7B, and 8B are cross-sectional views taken along line II-II' of FIG. 1, illustrating a memory device according to exemplary embodiments of the present invention. FIGS. 6C, 7C, and 8C are cross-sectional views taken along line II-II' of FIG. 1, illustrating a memory device according to other exemplary embodiments of the present invention.

First, a memory device according to exemplary embodiments of the present invention will now be described with reference to FIGS. 1, 8A, and 8B.

Referring to these figures, a plurality of impurity regions, e.g., an m-number of impurity regions IL1, IL2, . . . , and ILm, may be disposed parallel to each other on predetermined regions of a semiconductor substrate 100 of a first conductivity type. A separation layer 105 may be disposed between the impurity regions IL1, IL2, . . . , and ILm to separate the impurity regions IL1, IL2, . . . , and ILm from each other. The separation layer 105 may be a trench isolation layer formed in a predetermined region of the semiconductor substrate 100. In this case, the impurity regions IL1, IL2, . . . , and ILm may be provided in a plurality of active regions, respectively, each of which is defined by the trench isolation layer. The active regions may be an m-number of active regions AL1, AL2, . . . , and ALm. The active regions AL1, AL2, . . . , and ALm may be cell active regions defined in a cell region of the memory device. The impurity regions IL1, IL2, . . . , and ILm may have a second conductivity type different from the first conductivity type.

In exemplary embodiments of the present invention, it is assumed that the first and second conductivity types are a p-type and an n-type, respectively, for clarity of explanation. However, the first and second conductivity types may be an n-type and a p-type, respectively.

A mold insulating layer 110 is disposed on the semiconductor substrate 100 having the impurity regions IL1, IL2, . . . , and ILm and the separation layer 105. Predetermined regions of the impurity regions IL1, IL2, . . . , and ILm are exposed by a plurality of cell diode holes 115 that penetrate the mold insulating layer 110. Lower regions of the cell diode holes 115 may be filled with semiconductor patterns 128, respectively. Each of the semiconductor patterns 128 may include a first semiconductor pattern 126 and a second semiconductor pattern 127 that are sequentially stacked. The second semiconductor patterns 127 may have the second conductivity type, and the first semiconductor patterns 126 may have the first or second conductivity type. When the first semiconductor patterns 126 have the first conductivity type, the first and second semiconductor patterns 126 and 127, which are sequentially stacked in the cell diode holes 115, constitute cell diodes, respectively. Alternatively when both the first and second semiconductor patterns 126 and 127 have the first conductivity type, the first semiconductor patterns 126 and the impurity regions IL1, IL2, . . . , and ILm that contact the first semiconductor patterns 126, constitute cell diodes, respectively. Therefore, the cell diodes may be vertical-contact-type cell diodes.

Cell diode electrodes (not shown) may be provided on top surfaces of the second semiconductor patterns 127, respectively. The cell diode electrodes may be include a metal silicide layer, and have surfaces lower than the top surface of the mold insulating layer 110. Lower electrodes 135 are respectively disposed in the cell diode holes 115 on the cell diode electrodes. Surfaces of the lower electrodes 135 may be substantially the same level as, or lower than, the top surface of the mold insulating layer 110.

At least one conductive line is disposed on the mold insulating layer 110. In exemplary embodiments of the present invention, a plurality of other conductive lines may be provided parallel to the conductive line. That is, a plurality of parallel conductive lines may be disposed on the mold insulating layer 110.

Hereinafter, for clarity of explanation, the conductive lines will be referred to as bit lines. The bit lines comprise an n-number of bit lines BL1, BL2, . . . , and BLn. The bit lines BL1, BL2, . . . , and BLn are formed of a conductive material layer. For example, they may be formed of a single metal layer, or a sequentially stacked metal nitride layer and a metal layer. The metal nitride layer may be a titanium nitride layer.

Data storage elements 147a, self-aligned with the bit lines BL1, BL2, . . . , and BLn, are interposed between the mold insulating layer 110 and the bit lines. In other words, the data storage elements 147a are each self-aligned with one selected bit line, and disposed under that selected bit line. When viewed in a plan view, each of the data storage elements 147a may have a substantially tetragonal shape. That is, each of the data storage elements 147a may have four sidewalls. A pair of opposite sidewalls of the data storage elements 147a are self-aligned with the bit lines BL1, BL2, . . . , and BLn to be parallel to a lengthwise direction of the bit lines. The other pair of opposite sidewalls of the data storage elements 147a may be parallel to a widthwise direction of the bit lines. In other words, one pair of opposite sidewalls is generally parallel to the bitlines, while the other pair of sidewalls is perpendicular to the bit lines.

The data storage elements 147a are spaced apart from each other. That is, the data storage elements 147a may be island shaped, spaced apart from each other. The data storage elements 147a respectively cover the lower electrodes 135. Accordingly, the bit lines BL1, BL2, . . . , and BLn may pass over the lower electrodes 135.

The data storage elements 147a include resistor patterns 141a and barrier patterns 146a that are sequentially stacked. The resistor patterns 141a may include a material layer whose resistance varies with current. For instance, the resistor patterns 141a may include a phase-change material layer with a resistance that depends on a phase of the phase-change material layer, and the resistance varies with current flowing through the resistor patterns 141a. For example, the phase-change material layer may include a chalcogenide layer. Thus, the resistor patterns 141a can be realized as a variable resistor. The barrier patterns 146a may comprise a metal nitride layer, such as a titanium nitride layer, and may serve as an upper electrode.

Insulating material layer patterns cover the opposite sidewalls of the data storage elements 147a that are substantially parallel to the widthwise direction of the bit lines BL1, BL2, . . . , and BLn. When viewed from above, the insulating material layer patterns may be arranged in parallel lines that cross the bit lines. In this case, the insulating material layer patterns are disposed below the bit lines at intersections between the insulating material layer patterns and the bit lines. Specifically, regions between the data storage elements 147a disposed under one selected bit line may be filled with the insulating material layer patterns, as shown in FIG. 8B. In this case, the insulating material layer patterns may be interlayer dielectric patterns 160. That is, the interlayer dielectric patterns 160 may fill the regions between the data storage elements 147a and be disposed under the bit lines BL1, BL2, . . . , and BLn so that the bit lines overlap the interlayer dielectric patterns 160. The interlayer dielectric patterns 160 may be substantially vertically aligned with the separation layer 105. Further, protective insulating layer patterns 155a may be interposed between the interlayer dielectric patterns 160 and the data storage elements 147a and between the interlayer dielectric patterns 160 and the mold insulating layer 110.

Meanwhile, according to another embodiment, as shown in FIG. 8C, the insulating material layer patterns covering the opposite sidewalls of the data storage elements 147a that are parallel to the widthwise direction of the bit lines BL1, BL2, . . . , and BLn, may be insulating protective spacers 260.

An inter-metal dielectric layer 170 covers the bit lines BL1, BL2, . . . , and BLn. Thus, the inter-metal dielectric layer 170 may cover the sidewalls of the data storage elements 147a that are parallel to the lengthwise direction of the bit lines, and the insulating material layer patterns may cover the sidewalls of the data storage elements 147a that are parallel to the widthwise direction of the bit lines. That is, the sidewalls of the data storage elements 147a that are substantially parallel to the widthwise direction of the bit lines may be covered by the interlayer dielectric patterns 160 or the protective insulating layer patterns 155a, as shown in FIG. 8B, or covered by the insulating protective spacers 260, as shown in FIG. 8C.

Conductive plugs 175 are formed through the inter-metal dielectric layer 170. The conductive plugs 175 may be in ohmic contact with the predetermined regions of the impurity regions IL1, IL2, . . . , and ILm. Metal interconnections may be disposed on the inter-metal dielectric layer 170 to cover the conductive plugs 175. The metal interconnections may function as word lines. That is, a plurality of parallel word lines, i.e., an m-number of word lines WL1, WL2, . . . , and WLm may be disposed on the inter-metal dielectric layer 170. The word lines WL1, WL2, . . . , and WLm may cover the conductive plugs 175 and cross the bit lines BL1, BL2, . . . , and BLn. It is obvious to one skilled in the art that the connection structure of the word lines WL1, WL2, . . . , and WLm can be modified according to design conditions.

As described above, a unit cell may include a vertical-contact-type cell diode, a lower electrode 135, and a data storage element 147a that are vertically aligned with each other and sequentially stacked on the semiconductor substrate 100. As a result, the integration density of the cell can be increased. Further, each of the bit lines BL1, BL2, . . . , and BLn, which covers the data storage elements 147a, is self-aligned with the data storage elements 147a. That is, the data storage elements 147a, which are disposed under the bit lines, are arranged to be self-aligned with the bit lines, thus increasing the integration density of the cell. Accordingly, it is possible to minimize the planar area of the unit cell including at least one data storage element self-aligned with at least one selected bit line under the selected bit line, a lower electrode contacting a bottom surface of the data storage element, and a cell diode connected to a bottom surface of the lower electrode. As a result, the cell structure can be highly integrated.

Hereinafter, methods of fabricating a memory device according to exemplary embodiments of the present invention will be described with reference to FIGS. 1, 2A, 3A, 4A, 5A, 6A, 7A, 8A, 2B, 3B, 4B, 5B, 6B, 7B, and 8B.

Figure 2A:
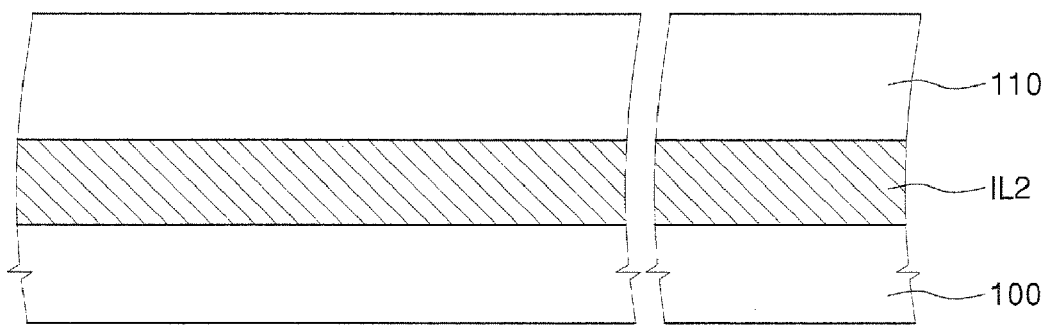
Figure 2B:
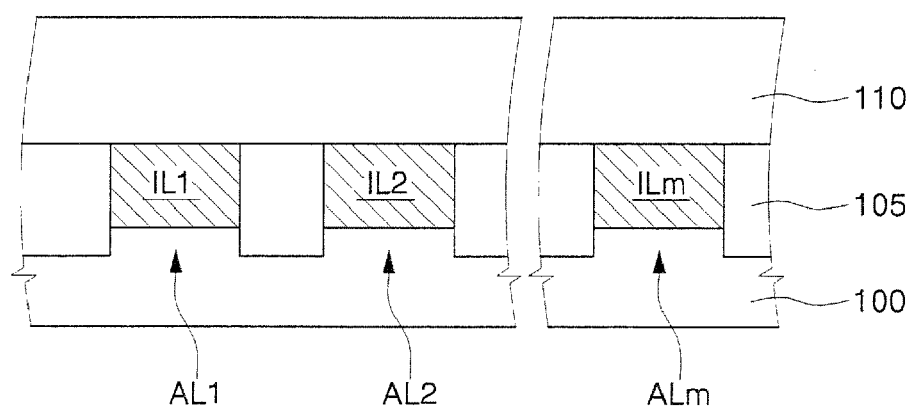

Referring to FIGS. 1, 2A and 2B, a semiconductor substrate 100 of a first conductivity type is prepared. A separation layer, for example, an isolation layer 105, may be formed in predetermined regions of the semiconductor substrate 100 to define a plurality of active regions. The isolation layer 105 may be a shallow trench isolation layer. The active regions may be an m-number of active regions AL1, AL2, . . . , and ALm. The active regions may be defined to be substantially parallel to each other. Impurity ions of a second conductivity type different from the first conductivity type are implanted into the active regions AL1, AL2, . . . , and ALm, thereby forming impurity regions IL1, IL2, . . . , and ILm of the second conductivity type. As a result, the isolation layer 105 serves to electrically isolate the impurity regions of the second conductivity type from each other. The first and second conductivity types may be p and n-type, respectively, or vise versa.

A mold insulating layer 110 is formed on the entire surface of the semiconductor substrate 100 having the impurity regions IL1, IL2, . . . , and ILm of the second conductivity type. The mold insulating layer 110 may include a silicon oxide layer.

Figure 3A:
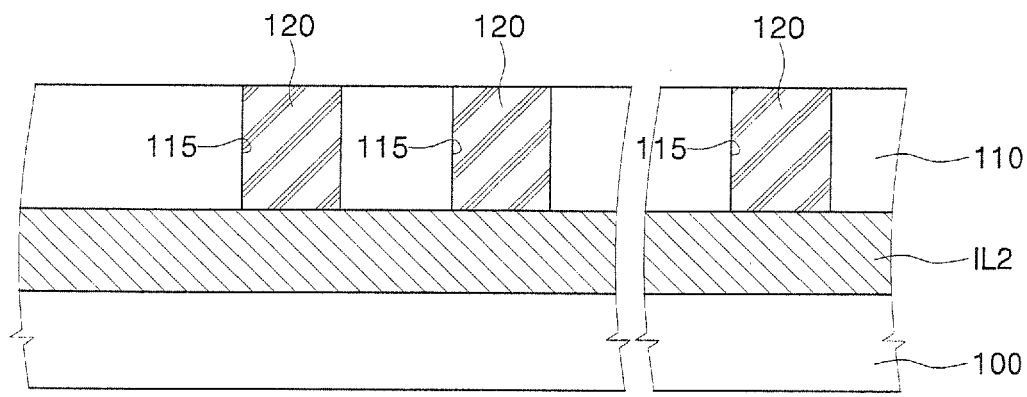
Figure 3B:
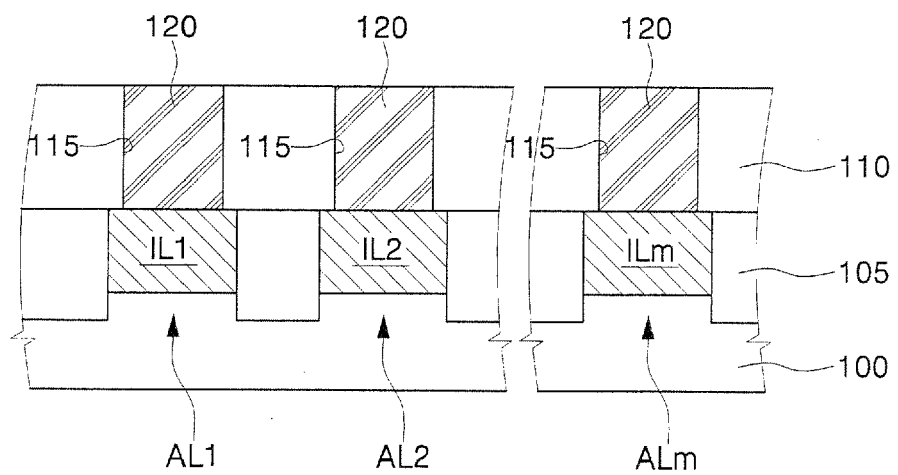

Referring to FIGS. 1, 3A, and 3B, the mold insulating layer 110 is patterned to form cell diode holes 115 that expose predetermined regions of the impurity regions IL1, IL2, . . . , and ILm of the second conductivity type.

A semiconductor layer is formed to fill the cell diode holes 115. The semiconductor layer may be obtained using a selective epitaxial growth (SEG) technique, which employs the exposed regions of the impurity regions IL1, IL2, . . . , and ILm of the second conductivity type as seed layers. Therefore, when the impurity regions of the second conductivity type have a single-crystalline structure, the semiconductor layer also may be formed to have a single-crystalline structure. When the SEG technique makes use of a silicon source gas, the semiconductor layer may be a silicon layer. The semiconductor layer may have a top surface higher than a top surface of the mold insulating layer 110. In this case, the semiconductor layer may be planarized to leave semiconductor patterns 120 in the cell diode holes 115. As a result, the semiconductor patterns 120 may have flat surfaces at the same level as the top surface of the mold insulating layer 110.

Alternatively, the semiconductor layer may be obtained using a solid phase epitaxial (SPE) technique. In this case, the semiconductor patterns 120 may be formed by planarizing the semiconductor layer obtained using the SPE technique.

Figure 4A:
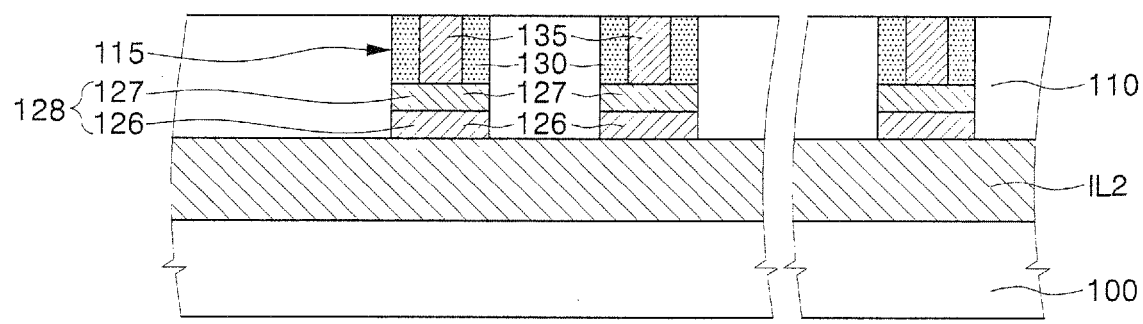
Figure 4B:
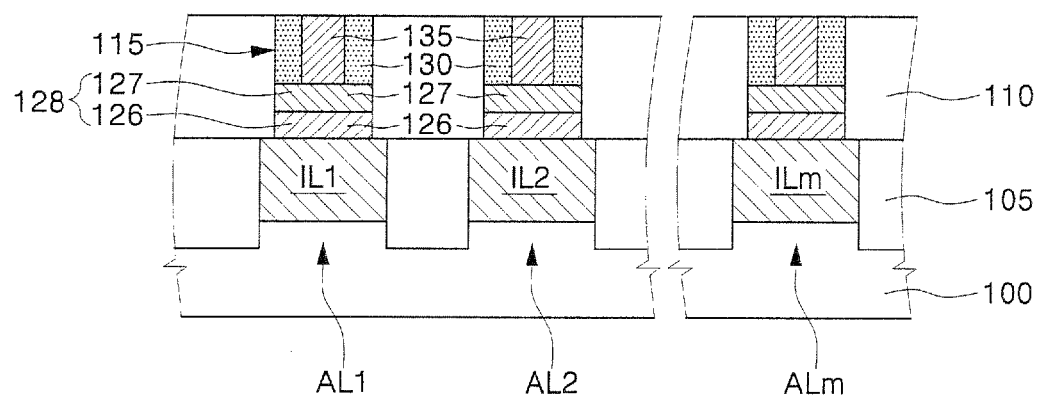

Referring to FIGS. 1, 4A and 4B, the semiconductor patterns 120 are partially etched to form recessed semiconductor patterns 128 having surfaces lower than the top surface of the mold insulating layer 110. As a result, upper regions of the cell diode holes 115 are exposed to form upper cell diode holes. Impurity ions of the first or second conductivity type are implanted into lower regions of the recessed semiconductor patterns 128, thereby forming first semiconductor patterns 126. Accordingly, the first semiconductor patterns 126 may have the first or second conductivity type. Also, impurity ions of the first conductivity type are implanted into upper regions of the recessed semiconductor patterns 128, thereby forming second semiconductor patterns 127. Thus, the second semiconductor patterns 127 may have the first conductivity type. The ion implantation process for forming the first semiconductor patterns 126 may be performed after the ion implantation process for forming the second semiconductor patterns 127.

When the first semiconductor patterns 126 are doped with the impurity ions of the second conductivity type, the first and second semiconductor patterns 126 and 127, which are sequentially stacked in the cell diode holes 115, constitute cell diodes, respectively. Alternatively, when the first semiconductor patterns 126 are doped with the impurity ions of the first conductivity type, the impurity regions IL1, IL2, . . . , and ILm of the second conductivity type and the first semiconductor patterns 126, which contact the impurity regions, constitute cell diodes, respectively. Therefore, the cell diodes may be formed as vertical-contact-type cell diodes.

Although not shown in the drawings, cell diode electrodes may be fonned on surfaces of the second semiconductor patterns 127. The cell diode electrodes may include a metal silicide layer, such as a cobalt silicide layer, a nickel silicide layer, or a titanium silicide layer. The metal silicide layer may be formed using a typical self-aligned silicide (salicide) technique. In this case, the cell diode electrodes may still have surfaces lower than the top surface of the mold insulating layer 110.

Insulating contact spacers 130 may be formed to cover the exposed sidewalls of the upper cell diode holes. The insulating contact spacers 130 may include a silicon oxide layer or a silicon nitride layer. Subsequently, a conductive layer is formed on the semiconductor substrate 100 having the insulating contact spacers 130 to fill the upper cell diode holes. The conductive layer is planarized until the top surface of the mold insulating layer 110 is exposed, thereby forming lower electrodes 135 remaining in each of the upper cell diode holes. Specifically, the planarization of the conductive layer may be performed using a chemical mechanical polishing (CMP) technique until the top surface of the mold insulating layer 110 is exposed. As a result, surfaces of the lower electrodes 135 may be substantially level with the top surface of the mold insulating layer 110. Alternatively, the conductive layer may be planarized by an etchback process to expose the top surface of the mold insulating layer 110, in which case the surfaces of the lower electrodes 135 may be lower than the top surface of the mold insulating layer 110.

The lower electrodes 135 may include a conductive layer that does not react with phase-change material layers, which will be formed in a subsequent process. For example, the lower electrodes 135 may comprise a metal nitride layer, such as a titanium nitride layer.

Figure 5A:
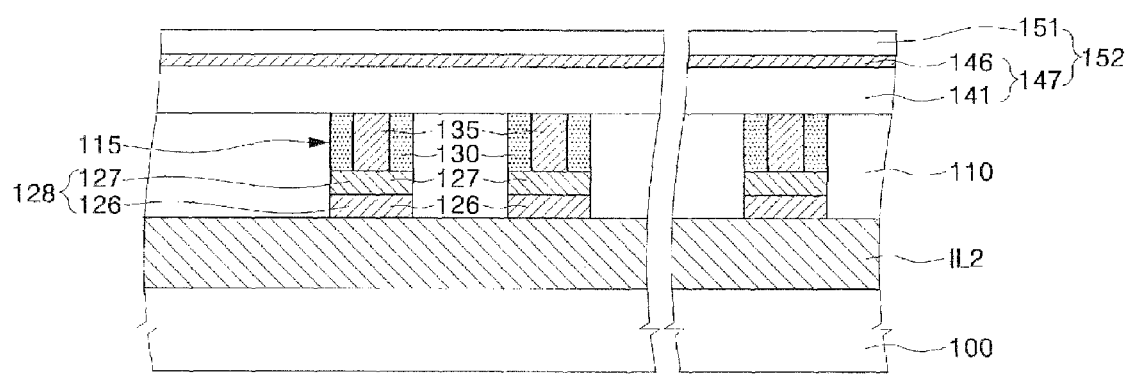
Figure 5B:
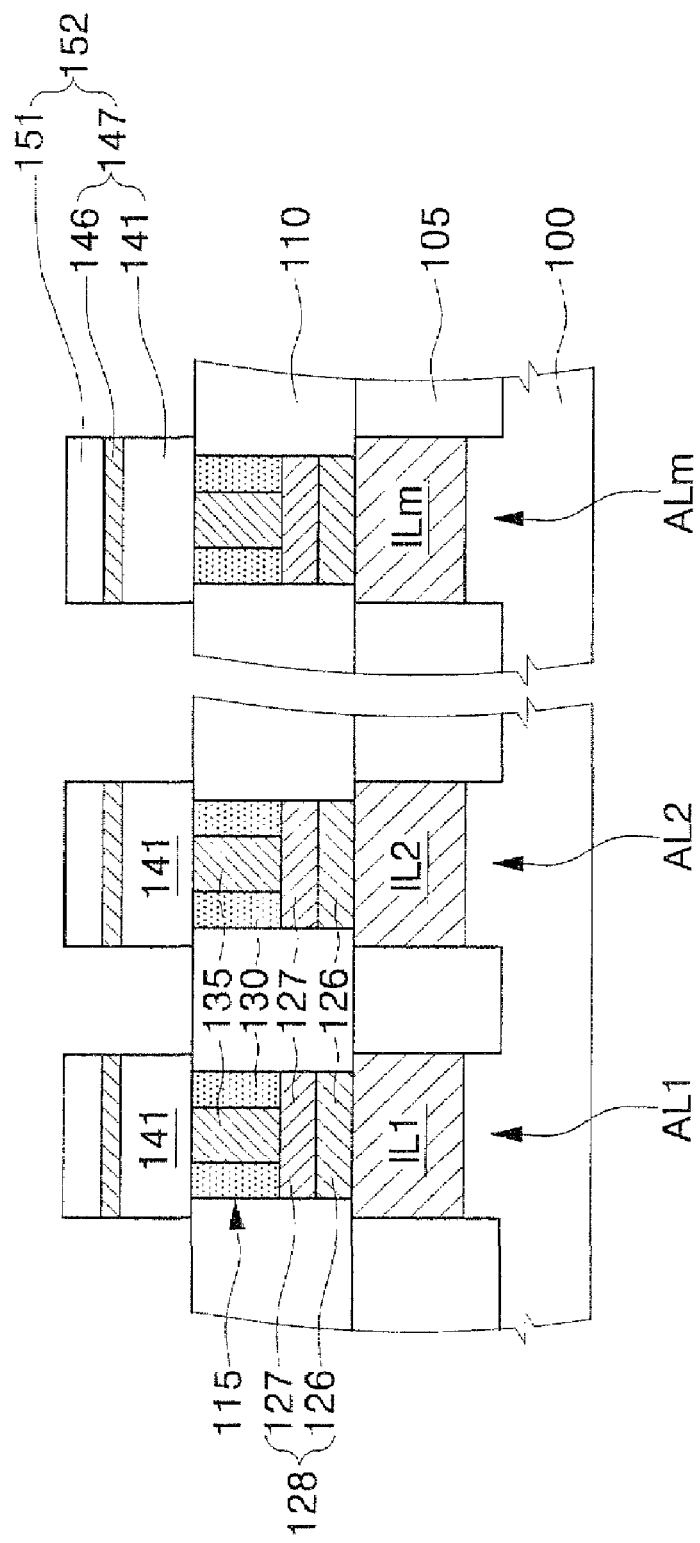

Referring to FIGS. 1, 5A and 5B, a plurality of parallel memory patterns 152 are formed on the semiconductor substrate having the lower electrodes 135 to cover the lower electrodes 135, respectively. The memory patterns 152 may be formed by sequentially stacking data storage element lines 147 and sacrificial insulating layer patterns 151. The data storage element lines 147 may be obtained by sequentially stacking resistor lines 141 and barrier layers 146. The resistor lines 141 may include a material layer with a resistance that varies with current. For example, the resistor lines 141 may include a phase-change material layer with a resistance that depends on a phase of the phase-change material layer. As an example, the phase-change material layer may be a chalcogenide layer. The barrier layers 146 may include a material that does not react with the resistor lines 141. For example, the barrier layers 146 may comprise a metal nitride layer such as a titanium nitride layer. The sacrificial insulating layer patterns 151 may include a silicon nitride layer.

The sacrificial insulating layer patterns 151 may be omitted. If so then the memory patterns 152 may include only the data storage element lines 147, i.e., the resistor lines 141 and the barrier layers 146 that are sequentially stacked.

Referring to FIGS. 1, 6A, and 6B, a protective insulating layer 155 may be conformably formed on the semiconductor substrate having the sacrificial insulating layer patterns 151. An interlayer dielectric layer is formed on the entire surface of the semiconductor substrate having the protective insulating layer 155. The interlayer dielectric layer may include a material having an etch selectivity with respect to the sacrificial insulating layer patterns 151. For example, when the sacrificial insulating layer patterns 151 are formed of a silicon nitride layer, the interlayer dielectric layer may be a silicon oxide layer. In this case, the protective insulating layer 155 may include a material having a different polishing rate from the interlayer dielectric layer. For example, when the interlayer dielectric layer is formed of a silicon oxide layer, the protective insulating layer 155 may include a silicon nitride.

The interlayer dielectric layer is planarized, thereby forming interlayer dielectric layer patterns 160 that remain between the memory patterns 152. When the protective insulating layer 155 is formed of a material having a different polishing rate from the interlayer dielectric layer, the interlayer dielectric layer may be planarized using the protective insulating layer 155 as a planarization stop layer.

The protective insulating layer 155 may be omitted. If so then the interlayer dielectric layer may include a material having a different polishing rate from, and an etch selectivity with respect to, the sacrificial insulating layer patterns 151. For example, when the sacrificial insulating layer patterns 151 are formed of a silicon nitride layer, the interlayer dielectric layer may be a silicon oxide layer.

Meanwhile, according to another embodiment, as shown in FIG. 6C, after the data storage element lines 147 are formed, insulating protective spacers 260 may be formed to cover sidewalls of the data storage element lines 147. Specifically, an insulating layer may be conformably formed on the semiconductor substrate having the data storage element lines 147. Subsequently, the insulating layer may be anisotropically etched to form the insulating protective spacers 260 covering the sidewalls of the data storage element lines 147. As a result, the sidewalls of the data storage element lines 147 may be covered by the insulating protective spacers 260, and top surfaces of the data storage element lines 147 may be exposed.

Referring to FIGS. 1, 7A, and 7B, a process of exposing the top surfaces of the data storage element lines 147 is carried out. The top surfaces of the data storage element lines 147 may be exposed by an etching process. Specifically, when the sacrificial insulating layer patterns (151 of FIGS. 6A and 6B) and the protective insulating layer (155 of FIGS. 6A and 6B) are formed on the data storage element lines 147, the protective insulating layer (155 of FIGS. 6A and 6B) and the sacrificial insulating layer patterns (151 of FIGS. 6A and 6B) are selectively removed on the data storage element lines 147. As a result, the top surfaces of the data storage element lines 147 may be exposed. In this case, protective insulating layer patterns 155a may be formed to cover not only a bottom surface and sidewalls of the interlayer dielectric layer patterns 160, but also sidewalls of the data storage element lines 147.

Alternatively, when the protective insulating layer (155 of FIGS. 6A and 6B) is omitted, the sacrificial insulating layer patterns (151 of FIGS. 6A and 6B) are selectively removed on the data storage element lines 147. As the top surfaces of the data storage element lines 147 are exposed, top surfaces of the interlayer dielectric layer patterns 160 may be lowered to some extent. However, the top surfaces of the interlayer dielectric layer patterns 160 may still be higher than the top surfaces of the data storage element lines 147.

Thereafter, a conductive layer is formed on the entire surface of the semiconductor substrate 100 having the data storage element lines 147 and the interlayer dielectric layer patterns 160. The conductive layer is patterned to form at least one conductive line crossing the data storage element lines 147 and the interlayer dielectric layer patterns 160.

Meanwhile, a hard mask layer may be formed on the conductive layer. Thus, a hard mask pattern (not shown) may be formed on the conductive line. The conductive line may be a bit line. The bit line may be plurally formed. That is, a plurality of parallel bit lines may be formed across the data storage element lines 147 and the interlayer dielectric layer patterns 160. The bit lines may be formed to include an n-number of bit lines BL1, BL2, . . . , and BLn.

Meanwhile, when insulating protective spacers 260 are formed, as shown in FIG. 6C, the parallel bit lines BL 1, BL2, . . . , and BLn may be formed across the insulating protective spacers 260 and the data storage element lines 147, as shown in FIG. 7C. As a result, the sidewalls of the data storage elements 147a (yet to be formed, as in FIGS. 8A and 8B), which are substantially parallel to a widthwise direction of the bit lines BL1, BL2, . . . , and BLn, may be covered by the bit lines. In this case, the bit lines may be formed by sequentially stacking a metal nitride layer and a metal layer. Here, the data storage element lines 147 may include resistor lines 141. The metal nitride layer can prevent the resistor lines 141 from reacting with the metal layer.

Referring to FIGS. 1, 8A, and 8B, the data storage element lines (147 of FIGS. 7A and 7B) are etched using the bit lines BL1, BL2, . . . , and BLn as an etch mask. Thus, data storage elements 147a are formed at intersections between the bit lines and the data storage element lines 147 to be self-aligned with the bit lines. As a result, sidewalls of the data storage elements 147a, which are parallel to a lengthwise direction of the bit lines BL1, BL2, . . . , and BLn, may be exposed as shown in FIG. 8A. Each of the data storage elements 147a may be formed in an island shape spaced apart from each other. The sidewalls of the data storage elements 147a, which are substantially parallel to the widthwise direction of the bit lines BL1, BL2, . . . , and BLn, may be covered by the interlayer dielectric layer patterns 160 or the protective insulating patterns 155a as shown in FIG. 8B.

Alternatively, the sidewalls of the data storage elements 147a, which are substantially parallel to the widthwise direction of the bit lines BL1, BL2, . . . , and BLn, may be covered by the insulating protective spacers 260 as shown in FIG. 8C. That is, the sidewalls of the data storage elements 147a, which are substantially parallel to the widthwise direction of the bit lines, may be covered by insulating material layer patterns.

Meanwhile, when the formation of the insulating material layer patterns is omitted, the sidewalls of the data storage elements 147a, which are substantially parallel to the widthwise direction of the bit lines, may be covered by the bit lines. In this case, the bit lines may be formed by sequentially stacking a metal nitride layer and a metal layer.

As described above, the formation of the data storage elements 147 may be performed by a photolithography process for forming the bit lines BL1, BL2, . . . , and BLn. The data storage elements 147a may be substantially formed by photolithography processes for forming line patterns. As a result, the size of the data storage elements 147a and a distance between the data storage elements 147a may be determined by a photolithography process that can minimize line widths. Accordingly, the area occupied by the data storage elements 147a can be minimized. As a result, the area of a unit cell can be reduced, thus the integration density of a memory device can be improved. Also, since the data storage elements 147a can be formed to be self-aligned with the bit lines BL1, BL2, . . . , and BLn, any misalignment between the data storage elements 147a and the bit lines can be solved.

The data storage elements 147a may be formed by sequentially stacking resistor patterns 141a and barrier patterns 146a. Thus, the resistor patterns 141a and the barrier patterns 146a are formed by substantially the same process. Accordingly, the resistor patterns 141a can be self-aligned with the barrier patterns 146a.

An inter-metal dielectric layer 170 is formed on the semiconductor substrate having the data storage elements 147a. The inter-metal dielectric layer 170 may include silicon oxide. The inter-metal dielectric layer 170 may be patterned to form openings 171 that expose predetermined regions of the impurity regions IL1, IL2, . . . , and ILm, respectively. The openings 171 may be filled with conductive plugs 175, respectively.

Thereafter, a plurality of parallel metal interconnections may be formed on the inter-metal dielectric layer 170 to cover the conductive plugs 175 and cross the bit lines BL1, BL2, . . . , and BLn. The metal interconnections may serve as word lines that include an m-number of word lines WL1, WL2, . . . , and WLm.

Meanwhile, when the bit lines BL1, BL2, . . . , and BLn are formed on the semiconductor substrate having the insulating protective spacers 260, as described with reference to FIG. 7C, the data storage element lines (147 of FIGS. 7A and 7C) are selectively removed using the bit lines BL1, BL2, . . . , and BLn as a mask as shown in FIG. 8C. Thus, final data storage elements 147a are formed at intersections between the bit lines and the data storage element lines (147 of FIGS. 7A and 7C) to be self-aligned with the bit lines. Accordingly, the sidewalls of the data storage elements 147a, which are parallel to the lengthwise direction of the bit lines, may be exposed. Subsequently, as described above with reference to FIGS. 8A and 8B, the inter-metal dielectric layer 170 covering the bit lines, the conductive plugs 175 passing through the inter-metal dielectric layer 170, and the word lines WL1, WL2, . . . , and WLm covering the conductive plugs 175 may be sequentially formed.

According to the present invention, as described above, a unit cell may include a vertical-contact-type cell diode, a lower electrode, and a data storage element, which are sequentially stacked on a semiconductor substrate and self-aligned with each other in a vertical direction. The data storage element is self-aligned with a bit line that covers and crosses the data storage element. The data storage element may include a resistor pattern and a barrier pattern, which are sequentially stacked. The resistor pattern and the barrier pattern can be formed using substantially the same process. That is, the resistor pattern can be self-aligned with the barrier pattern. Since the data storage element is formed to be self-aligned with the bit line, the size of the data storage element can be minimized. This results in the minimization of the planar area of a memory cell that includes the data storage element self-aligned with the bit line under the bit line, the lower electrode connected to, and disposed under, the data storage element, and the cell diode connected to, and disposed under, the lower electrode. Thus, a cell structure can be highly integrated. Consequently, the exemplary embodiments of the present invention can provide memory devices having a highly integrated cell structure.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a memory device, the method comprising:

forming a mold insulating layer on a semiconductor substrate;

forming parallel data storage element lines on the mold insulating layer;

forming a conductive line that crosses the data storage element lines; and etching the data storage element lines using the conductive line as an etch mask to form data storage elements that are self-aligned with the conductive line at an intersection of the conductive line and the data storage element lines;

after forming the data storage element lines, forming an interlayer dielectric layer pattern interposed between and spaced apart from the data storage element lines, wherein forming the interlayer dielectric layer pattern comprises:

forming an interlayer dielectric layer on the semiconductor substrate having the data storage element lines; and planarizing the interlayer dielectric layer; and before forming the interlayer dielectric layer, forming a protective insulating layer having a different polishing rate from the interposed interlayer dielectric layer on the semiconductor substrate having the data storage element lines, wherein forming the protective insulating layer and forming the interlayer dielectric layer include separating the interposed interlayer dielectric layer from the data storage element lines.

2. The method according to claim 1, wherein each of the data storage element lines is formed by sequentially stacking a resistor line and a barrier layer.

3. The method according to claim 2, wherein the resistor line includes a phase-change material layer.

4. The method according to claim 2, wherein the barrier layer comprises a metal nitride layer.

5. The method according to claim 1, wherein the conductive line is formed by sequentially stacking a metal nitride layer and a metal layer.

6. A method of fabricating a memory device, the method comprising:
- forming a data storage element pattern over a semiconductor substrate and over a mold insulating layer;
- forming a protective insulating layer on the data storage element pattern and on portions of the mold insulating layer;
- forming an interlayer dielectric layer on the protective insulating layer;
- planarizing the interlayer dielectric layer using the protective insulating layer as a planarization stop layer, and forming an interlayer dielectric layer pattern adjacent to and spaced apart from the data storage element pattern;
- forming a bit line pattern that crosses the data storage element pattern; and
- etching the data storage element pattern using the bit line pattern as an etch mask to form a data storage element.

7. The method according to claim 6, further comprising forming a vertical-contact-type cell diode below the data storage element.

8. The method according to claim 7, wherein the data storage element pattern includes a resistor line and a barrier layer,
the method further comprising:
- forming a lower electrode below the data storage element pattern including the resistor line and the barrier layer and between the data storage element and the vertical-contact-type cell diode; and
- forming insulating contact spacers on sidewalls of the lower electrode.

9. The method according to claim 8, wherein the resistor line includes a phase-change material layer.

10. The method according to claim 9, wherein the bit line pattern includes a metal nitride layer and a metal layer.

11. The method according to claim 9, wherein the data storage element pattern comprises a line and the bit line pattern comprises a line.

12. A method of fabricating a memory device, the method comprising:
- forming a mold insulating layer on a semiconductor substrate;
- forming parallel data storage element lines on the mold insulating layer over the semiconductor substrate;
- forming a protective insulating layer on the data storage element lines and on portions of the mold insulating layer;
- forming an interlayer dielectric layer on the protective insulating layer;
- planarizing the interlayer dielectric layer using the protective insulating layer as a planarization stop layer, and forming an interlayer dielectric layer pattern interposed between and spaced apart from the data storage element lines;
- forming a first conductive line that crosses the data storage element lines;
- etching the data storage element lines using the first conductive line as an etch mask to form data storage elements that are self-aligned with the first conductive line at an intersection of the first conductive line and the data storage element lines;
- forming an inter-metal dielectric layer to cover the first conductive line;
- forming conductive plugs through the inter-metal dielectric layer and coupled to predetermined regions of impurity regions disposed between the semiconductor substrate and the mold insulating layer; and
- forming a second conductive line covering one of the conductive plugs and crossing the first conductive line.

* * * * *

UNITED STATES PATENT AND TRADEMARK OFFICE
CERTIFICATE OF CORRECTION

| | | |
|---|---|---|
| PATENT NO. | : 7,625,777 B2 | Page 1 of 1 |
| APPLICATION NO. | : 11/428500 | |
| DATED | : December 1, 2009 | |
| INVENTOR(S) | : Se-Ho Lee et al. | |

It is certified that error appears in the above-identified patent and that said Letters Patent is hereby corrected as shown below:

Title page, item 57 Abstract, line 2, the word "stricture" should read -- structure --;

Column 5, line 6, the word "Predetennined" should read -- Predetermined --;

Column 8, line 33, the word "fonned" should read -- formed --;

Column 9, line 53, the word "fonned" should read -- formed --.

Signed and Sealed this

Twenty-third Day of February, 2010

David J. Kappos
*Director of the United States Patent and Trademark Office*